(12) United States Patent
Eida et al.

(10) Patent No.: US 7,550,914 B2
(45) Date of Patent: Jun. 23, 2009

(54) ORGANIC ELECTROLUMINESCENCE DISPLAY DEVICE

(75) Inventors: Mitsuru Eida, Sodegaura (JP); Hitoshi Kuma, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 279 days.

(21) Appl. No.: 10/590,062

(22) PCT Filed: Mar. 10, 2005

(86) PCT No.: PCT/JP2005/004227

§ 371 (c)(1),
(2), (4) Date: Aug. 21, 2006

(87) PCT Pub. No.: WO2005/098802

PCT Pub. Date: Oct. 20, 2005

(65) Prior Publication Data

US 2007/0164662 A1    Jul. 19, 2007

(30) Foreign Application Priority Data

Mar. 30, 2004    (JP)    ............................. 2004-100578

(51) Int. Cl.
*H01J 1/62*    (2006.01)

(52) U.S. Cl. ...................................... 313/504; 313/506

(58) Field of Classification Search ................. 313/498, 313/504, 506, 111
See application file for complete search history.

(56) References Cited

U.S. PATENT DOCUMENTS

| 5,869,929 A | 2/1999 | Eida et al. |
| 5,909,081 A | 6/1999 | Eida et al. |
| 6,137,459 A | 10/2000 | Eida et al. |
| 2002/0131008 A1 | 9/2002 | Iwase et al. |

FOREIGN PATENT DOCUMENTS

| EP | 1 087 448 | 3/2001 |
| JP | 72896/1988 | 5/1988 |
| JP | 50-190285 | 7/1993 |
| JP | 8-54832 | 2/1996 |
| JP | 11-329743 | 11/1999 |
| JP | 11-345688 | 12/1999 |
| WO | 98/34437 | 6/1998 |

*Primary Examiner*—Vip Patel
(74) *Attorney, Agent, or Firm*—Oblon, Spivak, McClelland, Maier & Neustadt, P.C.

(57) ABSTRACT

An organic electroluminescent display (1) including: an organic electroluminescent device (10), and a color converting member (20) including a shielding layer (23) and a shielding layer aperture region (24) including a color converting layer (22), edges (23-1) of the aperture region (24) being closer to the center of the aperture region (24) than edges (41-1) of an emission region (41) of the organic electroluminescent device (10).

10 Claims, 8 Drawing Sheets

ORGANIC ELECTROLUMINESCENCE DISPLAY DEVICE

TECHNICAL FIELD

The invention relates to an organic electroluminescent display. More particularly, the invention relates to an organic electroluminescent display in which external light entering the display is prevented from being reflected/scattered in the device so that a decrease in contrast is suppressed.

BACKGROUND ART

In order to provide a practical organic electroluminescent (hereinafter may be abbreviated as "EL") display, a display shown in FIG. 9 has been disclosed (see patent document 1, for example).

In this organic EL display 9, the area of an aperture region 24 of a shielding layer (color converting layer 22) is increased in comparison with the area of an emission region 41 of an organic EL device 10 to allow light emitted from the organic EL device to efficiently enter the color converting layer, thereby improving the luminous efficiency of the organic EL display.

However, since edges 23-1 of the shielding layer are positioned outside edges 41-1 of the organic EL emission region in the above display, external light entering the organic EL emission region 41 through the aperture region 24 of the shielding layer is reflected/scattered at both ends of the emission region of the organic EL device (in this desplay, the edges of an inter-insulator 14). As a result, part of the reflected or scattered external light is emitted to the outside as display light and reaches the eyes of the viewer (human), whereby the organic EL display becomes difficult to see. Specifically, the contrast of the organic EL display is decreased (visibility is decreased).

The contrast ratio is expressed by ratio of the luminance during EL emission to the luminance during EL non-emission. Therefore, since the contrast ratio decreases as the luminance during EL non-emission increases due to reflected or scattered external light, the organic EL display becomes difficult to see.

[Patent document 1] WO98/34437

The invention was achieved in view of the above-described problem. An object of the invention is to provide an organic EL display exhibiting high contrast (high visibility).

DISCLOSURE OF THE INVENTION

The inventors of the invention conducted extensive studies in order to achieve the above object. As a result, the inventors have found that the amount of external light incident on the edges of the emission region of the organic EL device through the aperture region of the shielding layer can be reduced and, even if the incident external light is reflected/scattered at the edges of the emission region of the organic EL device, the reflected/scattered light can be prevented from escaping from the device by disposing the edges of the aperture region of the shielding layer closer to the center of the aperture region than the edges of the emission region of the organic EL device, whereby an organic EL display exhibiting high contrast can be obtained. This finding has led to the completion of the invention.

The invention provides the following organic EL display.
1. An organic electroluminescent display including: an organic electroluminescent device, and a color converting member including a shielding layer and a shielding layer aperture region including a color converting layer, edges of the aperture region being closer to the center of the aperture region than edges of an emission region of the organic electroluminescent device.
2. The organic electroluminescent display according to 1, wherein a perpendicular distance h (μm) from the shielding layer to an emitting layer of the organic electroluminescent device and a length X (μm) of an overlapping part of the shielding layer and the emission region satisfy the following expression (I).

$$X/h \geq 0.60 \qquad (I)$$

3. The organic electroluminescent display according to 1 or 2, wherein the area of the shielding layer aperture region is 70% or more of the area of the organic electroluminescent emission region.
4. The organic electroluminescent display according to any one of 1 to 3, further including a reflection preventing part on the side of the color converting member from which light from the organic electroluminescent device is outcoupled.
5. The organic electroluminescent display according to 4, wherein the reflection preventing part is a reflection preventing film.
6. The organic electroluminescent display according to 4, wherein the reflection preventing part is a non-glare film.
7. The organic electroluminescent display according to any one of 1 to 6, further including a transparent medium layer between the organic electroluminescent device and the color converting member.
8. The organic electroluminescent display according to any one of 1 to 7 which is actively driven.

An organic EL display of the invention can suppress a decrease in contrast of the organic EL display caused by reflection/scattering of incident external light in the device.

BEST MODE FOR CARRYING OUT THE INVENTION

Figure 1:
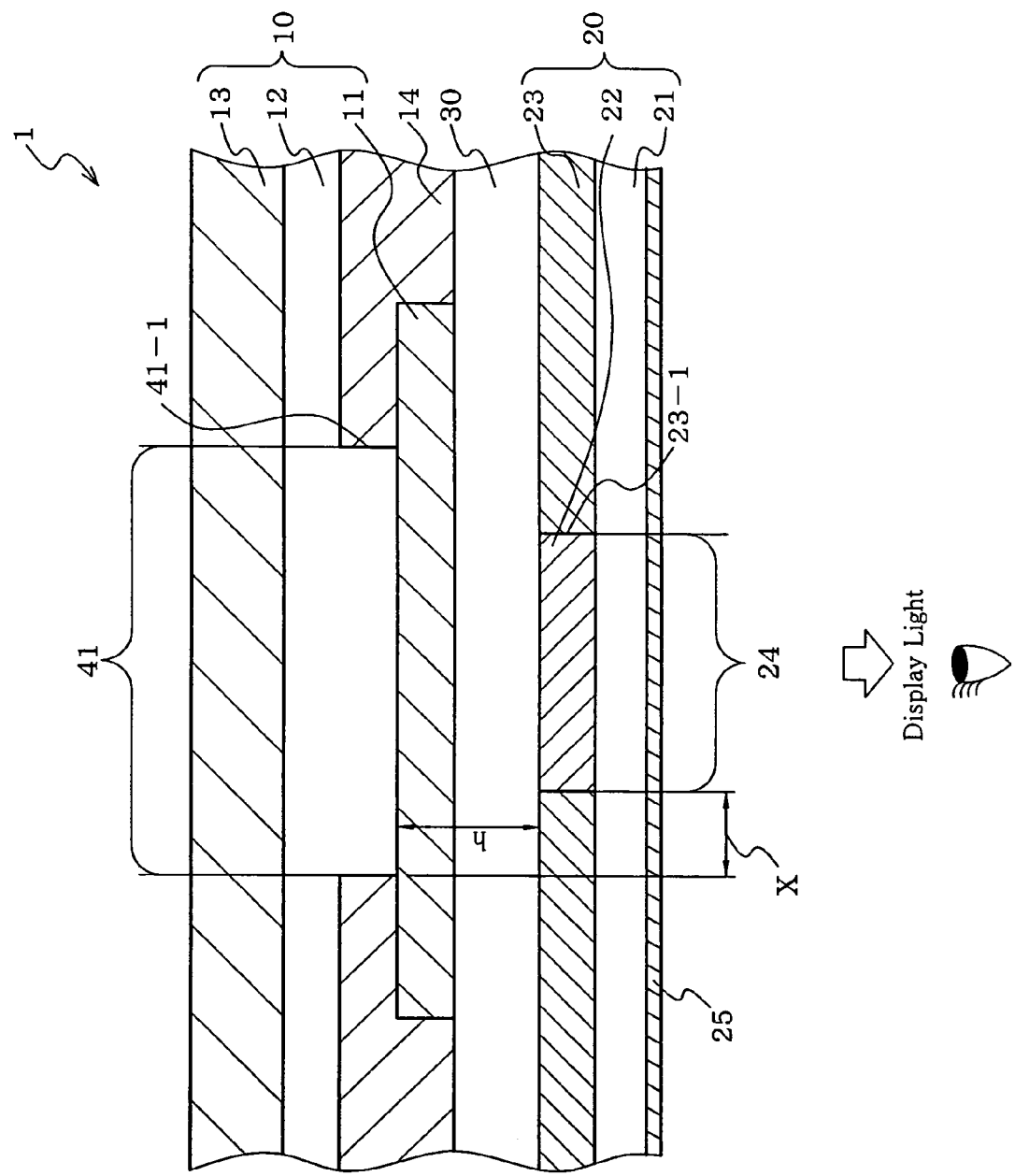
FIG. 1 is a view showing an organic EL display according to one embodiment of the invention.

FIG. 1 is a view showing an organic EL display which is one embodiment of the invention.

An organic EL display 1 shows an embodiment of a bottom emission type display in which light is outcoupled through a substrate on which an organic EL device is formed.

The organic EL display 1 has a configuration in which an organic EL device 10 and a color converting member 20 are combined with a transparent medium 30 therebetween.

The organic EL device 10 has a configuration in which a lower electrode 11, an emitting layer 12, and an upper electrode 13 are stacked in this order on the transparent medium 30. An inter-insulator 14 is formed between the organic EL device 10 and another organic EL device (not shown) adjacent thereto.

The lower electrode 11 and the upper electrode 13 supply electric charges (electrons or holes) to the emitting layer 12 when a voltage is applied between the electrodes. The emitting layer 12 emits light upon recombination of electrons and holes.

The color converting member 20 is formed by forming a color converting layer 22 (shielding layer aperture region 24) and a shielding layer 23 on a transparent substrate 21.

The transparent substrate 21 is a substrate which supports the color converting layer 22 and the shielding layer 23. The color converting layer 22 is a layer which adjusts and/or converts the wavelength of light emitted from the organic EL device 10 to produce light of an arbitrary color. The shielding layer 23 prevents the colors of light emitted from the adjacent devices from being mixed.

In the organic EL display 1, the region of the emitting layer 12 placed between the inter-insulators 14 serves as an emission region 41. Light emitted from the emission region 41 passes through the lower electrode 11 and the transparent medium 30 to reach the color converting member 20.

The light which has reached the color converting member 20 enters the color converting layer 22 and is adjusted and/or converted to have an arbitrary color. The light which has passed through the color converting layer 22 is outcoupled as display light through the transparent substrate 21 to the outside.

In this embodiment, edges 23-1 of the shielding layer are positioned closer to the center of the aperture region 24 than edges 41-1 of the emission region of the organic EL device. Specifically, the edges 23-1 of the shielding layer cover part of the emission region 41 to form an overlapping part X.

This configuration reduces the amount of external light which passes through the color converting layer 22 (shielding layer aperture region 24) and enters the organic EL display 1, whereby the reflection/scattering of the external light can be suppressed. Moreover, even if the external light is reflected or scattered in the device, since the reflected or scattered light is blocked by the shielding layer 23, it can be suppressed that the reflected or scattered light enters the color converting layer 22 and is emitted to the outside of the device as display light. This suppresses emission of light which is not emitted from the organic EL display 1, whereby the contrast of the organic EL display is increased (i.e. visibility is increased).

In this embodiment, the edges of the inter-insulator 14 form the edges of the emission region 41 of the organic EL device. Note that the invention is not limited thereto. For example, the edges of the lower electrode and the upper electrode form the edges of the emission region 41 when the inter-insulator is not used (portion placed between the lower electrode and the upper electrode serves as the emission region).

The transparent medium 30 is not an essential element. However, it is preferable to form the transparent medium 30, since the transparent medium 30 can reduce the unevenness of the surface of the color converting member due to the difference in thickness between the shielding layer and the color converting layer, surface roughness thereof, and the like to suppress a short circuit or breakage of the organic EL device, and can prevent occurrence of a dark spot of the organic EL device due to water released from the color converting member or the like.

Figure 2:
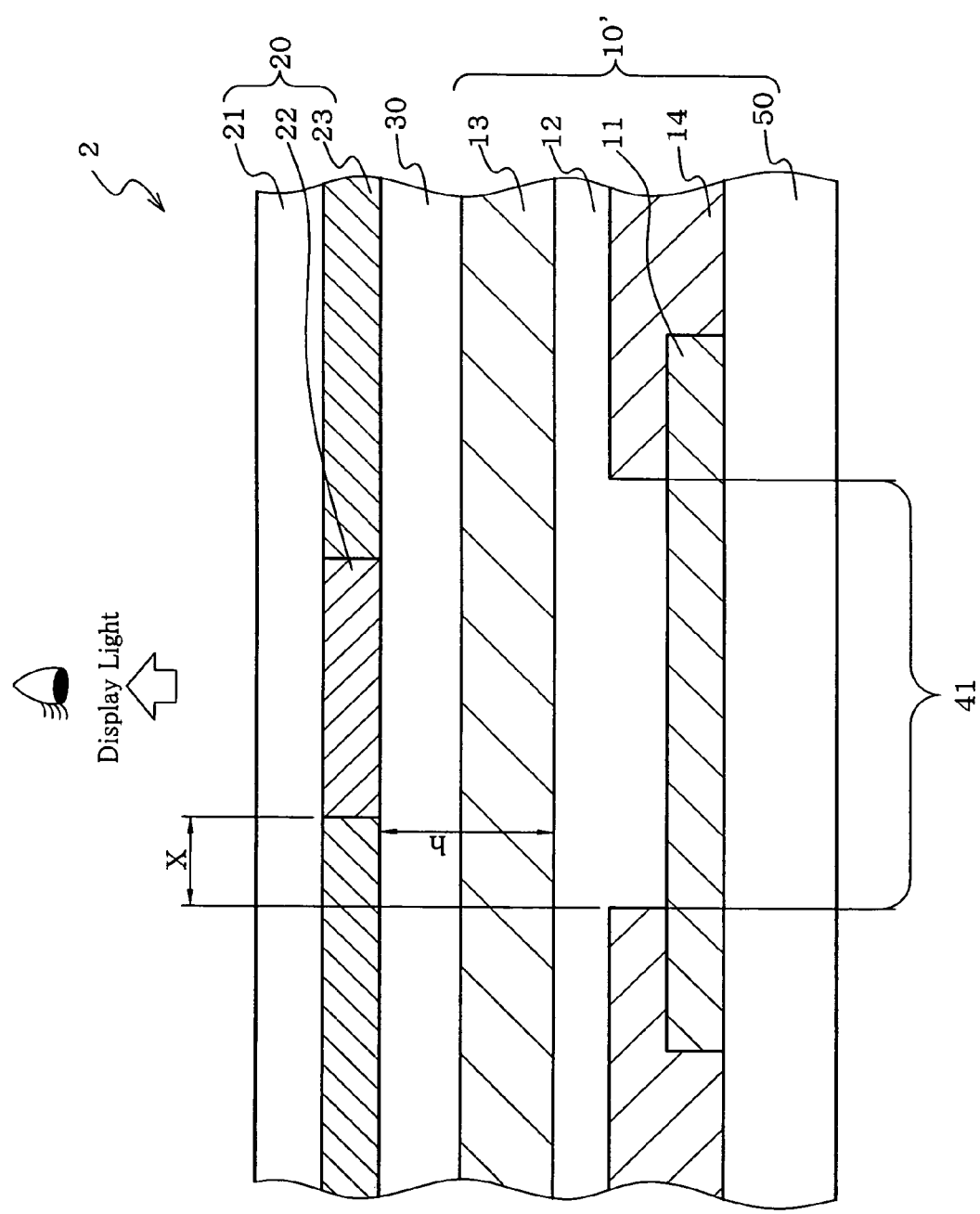
FIG. 2 is a view showing an organic EL display according to another embodiment of the invention.

FIG. 2 is a view showing another organic EL display according to the invention.

An organic EL display 2 shows an embodiment of a top emission type display in which light is outcoupled from the side opposite to a substrate on which an organic EL device is formed.

The same members as those of the above-described embodiment are assigned with the same reference numerals. Description thereof is omitted.

The organic EL display 2 has a configuration in which an organic EL device 10' and the color converting member 20 are combined with the transparent medium 30 therebetween.

The organic EL device 10' has a configuration in which the lower electrode 11, the emitting layer 12, and the upper electrode 13 are stacked in this order on a substrate 50. The remaining configuration is the same as that of the above-described first embodiment.

In the organic EL display 2, since light is outcoupled from the side opposite to the substrate 50, a TFT or the like formed on the substrate 50 in order to drive the EL device does not block the light emitted from the device. Therefore, a display exhibiting high luminous efficiency can be obtained.

In the organic EL display according to the invention, it is preferable that the perpendicular distance h (μm) from the shielding layer to the emitting layer of the organic EL device (luminescent medium of the organic EL device) and the length X (μm) of the overlapping part of the shielding layer and the organic EL emission region satisfy the following expression (I).

$$X/h \geq 0.60 \qquad (I)$$

The reason therefor is described below.

Figure 3:
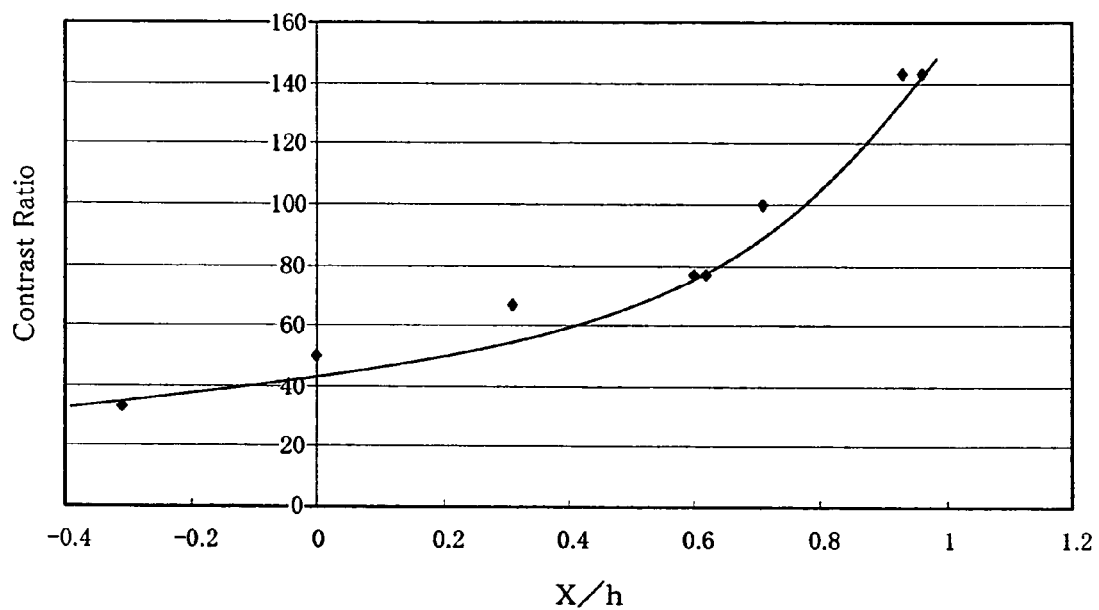
FIG. 3 is a view showing the relation between X/h and contrast ratio in an organic EL display.

FIG. 3 is a view showing the relationship between the value X/h and the contrast ratio.

FIG. 3 shows a graph of data obtained in the examples according to the invention and comparative examples described later. The contrast ratio is indicated as "100" when the ratio of the luminance during EL emission to the luminance during EL non-emission is "100:1".

As shown in FIG. 3, the contrast ratio increases as the value X/h increases. Moreover, the contrast ratio rapidly increases when the value X/h becomes 0.60 or more. Therefore, it is preferable that the value X/h of the organic EL display be 0.60 or more.

The reason therefor is briefly described below.

Figure 4:
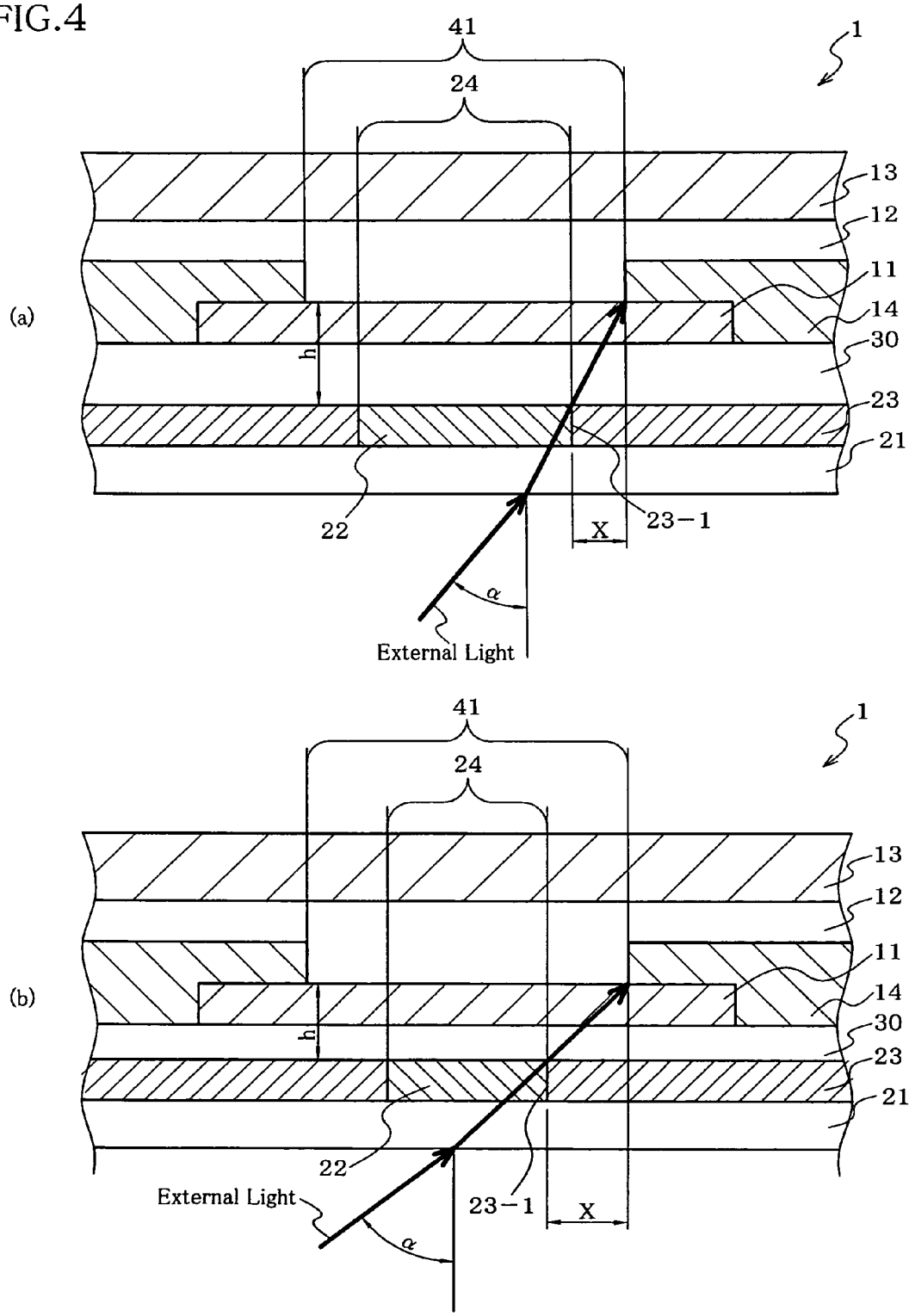
FIG. 4 is a view showing external light entering the organic EL display and (a) is a view showing the case of small X/h and (b) is a view showing the case of large X/h.

FIG. 4 is a view showing external light which enters the organic EL display. FIG. 4(a) shows the case where the value X/h is small, and FIG. 4(b) shows the case where the value X/h is large.

As shown in FIG. 4(a), when the value X/h is small, since the external light enters the organic EL display even when the incident angle (α) is small, a large amount of external light reaches the edges of the emission region 41 of the organic EL device 10 (the edges of the inter-insulator 14 in FIG. 4) and is reflected/scattered at the edges, whereby the contrast is decreased.

As shown in FIG. 4(b), when the value X/h is large, external light does not enter the organic EL display unless the incident angle (α) is increased to a certain extent. Therefore, the amount of external light which reaches the edges of the emission region 41 of the organic EL device 10 decreases to reduce reflection/scattering, whereby the contrast is increased.

Figure 5:
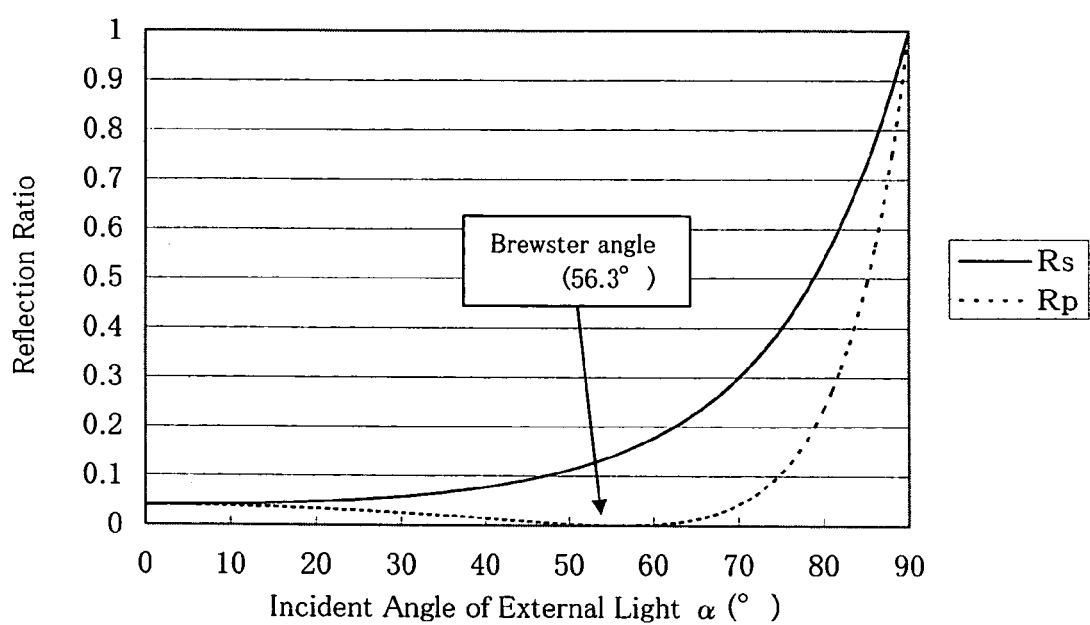
FIG. 5 is a view showing the relation between an incident angle of external light and a reflection ratio on a transparent substrate surface.

Since the reflectance of external light at the surface of the transparent substrate 21 increases when the incident angle of the external light exceeds a specific angle (Brewster angle: $\tan^{-1}$ (refractive index of medium the light enters/refractive index of medium from which the light enters)) from the Fresnel formula, the amount of external light which enters the organic EL display rapidly decreases. FIG. 5 shows the relationship between the incident angle and the reflectance of external light. FIG. 5 shows the case where external light enters a glass plate (corresponding to the transparent substrate 21) from air Rs indicates S-polarized external light, and Rp indicates P-polarized external light. When the value X/h is large, even if the external light is reflected/scattered in the organic EL display, the amount of light emitted to the outside again decreases.

It appears that the contrast ratio rapidly increases for the above reason when the value X/h becomes equal to or greater than a specific threshold value (0.60 in the invention).

Therefore, it is preferable that the value X/h be 0.60 or more ($X/h \geq 0.60$).

Note that the perpendicular distance h varies depending on the definition and the dimensions of the organic EL display. If the perpendicular distance h becomes larger, a mixed color or color smearing may occur. If the perpendicular distance h becomes smaller, defects may occur due to unevenness of the surface of the color converting member or gas released from the color converting member. Therefore, the perpendicular distance h is preferably 0.05 to 100 μm, and particularly preferably 0.1 to 20 μm.

The overlapping part X may be arbitrarily adjusted corresponding to the perpendicular distance h.

In the organic EL display according to the invention, since the emission region of the organic EL device is reduced by the shielding layer, the luminance of the organic EL display decreases in comparison with the case where the overlapping part (X) is not formed. This makes it necessary to increase the drive voltage in order to obtain a desired luminance.

Therefore, in the organic EL display according to the invention, the area of the aperture region of the shielding layer is preferably 70% or more, and still more preferably 80% or more (and less than 100%) of the area of the emission region of the organic EL device. If the area of the aperture region is less than 70% of the area of the emission region, the luminance of the organic EL device must be increased by 1.4 or more by increasing the drive voltage in order to obtain a luminance equal to that of a display in which the overlapping part (X) is not formed, although the drive voltage varies depending on the performance of the organic EL device. This results in an increase in the power consumption of the organic EL display.

In the organic EL display according to the invention, when the display becomes difficult to see due to reflection of external light at the surface of the color converting member such as the transparent substrate, it is preferable to dispose a reflection preventing part on the side of the color converting member from which the light emitted from the organic EL device is outcoupled (see reflection preventing part 25 in FIG. 1). As the reflection preventing part, a reflection preventing film may be formed, for example.

As the reflection preventing film, a film obtained by stacking thin films having different refractive indices (e.g. $SiO_2$, $TiO_2$, and $ZnO_2$) to a thickness quarter the wavelength (0.1 to 0.3 μm) of external light can be given. The surface reflectance can be reduced by forming such stacked films on the surface of the color converting member.

Reflection of the background may be reduced by using a non-glare film or the like which diffuses reflected light by making the surface uneven.

The elements of the organic EL display according to the invention are described below.

(A) Organic EL Device

In the organic EL device used in the invention, the organic emitting layer and the like (organic luminescent medium) are formed between the upper electrode and the lower electrode. Typical configuration examples of the organic luminescent medium formed between the electrodes are given below. Note that the organic EL device used in the invention is not limited to the following configuration examples.

(a) Organic emitting layer
(b) Hole-injecting layer/organic emitting layer
(c) Organic emitting layer/electron-injecting layer
(d) Hole-injecting layer/organic emitting layer/electron-injecting layer
(e) Organic semiconductor layer/organic emitting layer
(f) Organic semiconductor layer/electron barrier layer/organic emitting layer
(g) Hole-injecting layer/organic emitting layer/adhesion improving layer Of these, the configuration (d) is preferably used.

(1) Organic luminescent medium (i) Organic Emitting Layer

Examples of luminous materials of an organic emitting layer include only one or combinations of two or more selected from p-quaterphenyl derivatives, p-quinquephenyl derivatives, benzodiazole compounds, benzimidazole compounds, benzoxazole compounds, metal-chelated oxynoid compounds, oxadiazole compounds, styrylbenzene compounds, distyrylpyrazine derivatives, butadiene compounds, naphthalimide compounds, perylene derivatives, aldazine derivatives, pyraziline derivatives, cyclopentadiene derivatives, pyrrolopyrrole derivatives, styrylamine derivatives, coumarin compounds, aromatic dimethylidyne compounds, metal complexes having an 8-quinolinol derivative as a ligand, and polyphenyl compounds.

Among these organic luminous materials, 4,4-bis(2,2-di-t-butylphenylvinyl)biphenyl (abbreviated to DTBPBBi), 4,4'-bis(2,2-diphenylvinyl)biphenyl (abbreviated to DPVBi), and derivatives thereof, as aromatic dimethylidyne compounds, are more preferable.

Furthermore, it is preferred to use an organic luminescent material having a distyrylarylene skeleton or the like, as a host material together with a fluorescent dye giving intense from blue to red fluorescence, for example, a coumarin material or the like, as a dopant. More specifically, it is preferred to use the above-mentioned DPVBi or the like as a host and 1,4-bis[4-(N,N-diphenylaminostyrylbenzene)] (abbreviated to DPAVB) as a dopant.

(ii) Hole Injecting Layer

Compounds having a hole mobility of $1 \times 10^{-6}$ $cm^2/V \cdot s$ or more measured at an applied voltage of $1 \times 10^4$ to $1 \times 10^6$ V/cm and an ionization energy of 5.5 eV or less are preferably used in a hole injecting layer. Such a hole injecting layer enables good hole injection into an organic emitting layer, thereby enhancing a luminance or allowing low voltage drive.

Examples of a constituent material for the hole injection layer include porphyrin compounds, aromatic tertiary amine compounds, styrylamine compounds, aromatic dimethylidine compounds, and condensed aromatic ring compounds, e.g., organic compounds such as 4,4-bis[N-(1-naphthyl)-N- phenylamino]biphenyl (abbreviated NPD) and 4,4',4''-tris[N-(3-methylphenyl)-N-phenylamino]triphenylamine (abbreviated MTDATA).

Inorganic compounds such as p-type Si and p-type SiC are preferably used as a constituent material for the hole injection layer.

It is also preferred that an organic semiconductive layer having an electrical conductivity of $1 \times 10^{-10}$ S/cm or more is formed between the above hole injecting layer and an anode, or between the above hole injecting layer and an organic emitting layer. Such an organic semiconductive layer enables better hole injection into an organic emitting layer.

(iii) Electron Injecting Layer

Compounds having an electron mobility of $1 \times 10^{-6}$ cm$^2$/V·s or more measured at an applied voltage of $1 \times 10^4$ to $1 \times 10^6$ V/cm and an ionization energy more than 5.5 eV are preferably used in an electron injecting layer. Such an electron injecting layer enables good electron injection into an organic emitting layer, thereby enhancing a luminance or allowing low voltage drive.

Examples of a constituent material for the electron injecting layer include 8-hydroxyxinoline metal complexes such as Al chelate: Alq, derivatives thereof or oxadiazole derivatives.

(iv) Adhesion Improving Layer

An adhesion improving layer is a form of the electron injecting layer. That is, it is a special layer comprising a material with good adhesion properties to a cathode among electron injecting layers. The adhesion improving layer is preferably made of a material such as 8-hydroxyxinoline metal complexes or derivatives thereof.

It is also preferred that an organic semiconductor layer with an electric conductivity of $1 \times 10^{-10}$ S/cm or more is formed in contact with the above electron injecting layer. Such an organic semiconductor layer enables good electron injecting into an organic emitting layer.

(v) Thickness of the Organic Luminescent Medium

The thickness of the organic luminescent medium is not particularly limited. However it is preferably in the range of, for example, 5 nm to 5 µm. If the thickness is below 5 nm, the luminance and durability thereof may deteriorate, while if it is over 5 µm, the voltage to be applied may become high. Therefore, the thickness of the organic luminescent medium is more preferably 10 nm to 3 µm, and still more preferably 20 nm to 1 µm.

(2) Upper Electrode

An upper electrode corresponds to an anode or a cathode layer dependently on the structure of the organic EL device. In the case where the upper electrode corresponds to an anode layer, it is preferred to use a material having a large work function, for example, 4.0 eV or more, in order to make hole-injection easy. In the case where the upper electrode corresponds to a cathode layer, it is preferred to use a material having a small work function, for example, of less than 4.0 eV in order to make electron-injection easy.

In organic EL displays of top emission type, it is necessary for the upper electrode to have transparency in order to outcouple light through the upper electrode. Accordingly, in the case where the upper electrode corresponds to an anode layer, materials for the upper electrode include only one or combinations of two or more selected from indium tin oxide (ITO), indium zinc oxide (IZO), copper indium (CuIn), tin oxide (SnO$_2$), zinc oxide (ZnO), antimony oxide (Sb$_2$O$_3$, Sb$_2$O$_4$, Sb$_2$O$_5$), aluminum oxide (Al$_2$O$_3$) and so on.

In order to decrease the resistance of the upper electrode without damaging transparency, only one or combination of two or more selected from metals such as Pt, Au, Ni, Mo, W, Cr, Ta and Al is preferably added.

A constituent material of the upper electrode can be selected from the group consisting of light transmitting metal films, nondegenerate semiconductors, organic conductors, semiconductive carbon compounds and so on. Preferred organic conductors include conductive conjugated polymers, oxidizer-added polymers, reducer-added polymers, oxidizer-added low-molecular-weight molecules or reducer-added low-molecular-weight molecules.

Examples of oxidizers added to an organic conductor include Lewis acids such as iron chloride, antimony chloride and aluminum chloride. Examples of reducers added to an organic conductor include alkali metals, alkaline-earth metals, rare-earth metals, alkali compounds, alkaline-earth compounds or rare-earth compounds. Examples of conductive conjugated polymers include polyanilines and derivatives thereof, polytiophens and derivatives thereof and Lewis-acid-added amine compounds.

Preferred examples of nondegenerate semiconductors include oxides, nitrides or chalcogenide compounds.

Preferred examples of carbon compounds include amorphous C, graphite or diamond like C. Examples of inorganic semiconductors include ZnS, ZnSe, ZnSSe, MgS, MgSSe, CdS, CdSe, CdTe or CdSSe.

The thickness of the upper electrode is preferably decided considering its sheet resistance or the like. For example, the thickness of the upper electrode is preferably in the range of 50 to 5000 nm, more preferably 100 nm or more. Such a thickness allows a uniform thickness distribution and light transmission of 60% or more of EL emission as well as a sheet resistance of the upper electrode of 15 Ω/□ or less, more preferably 10 Ω/□ or less.

(3) Lower Electrode

A lower electrode corresponds to an anode or cathode layer dependently on the structure of the organic EL display. In the case where the lower electrode corresponds to a cathode layer, it is preferred to use a material having a smaller work function, for example, a metal, an alloy, an electrically conductive compound, a mixture thereof or a material containing at least one of them, having a work function of less than 4.0 eV.

As such materials, for example, it is preferred to use one or a combination of two or more selected from sodium, sodium-potassium alloys, cesium, magnesium, lithium, magnesium-silver alloys, aluminum, aluminum oxide, aluminum-lithium alloys, indium, rare earth metals, mixtures of these metals and organic luminescence medium materials, mixtures of these metals and electron injecting layer materials, and so on.

The thickness of the lower electrode is not particularly limited as well as the upper electrode. However, it is preferably in the range of, for example, 10 to 1000 nm, more preferably 10 to 200 nm.

An organic EL device fabrication will be described referring to an organic EL device of an anode/hole-injecting layer/emitting layer/electron-injecting layer/cathode as an example.

First, a thin film made of an anode material is formed into a thickness of 1 µm or less, preferably 10 to 200 nm on an appropriate transparent substrate by vapor deposition, sputtering or some other method, thereby forming an anode.

Next, a hole injecting layer is formed on this anode. The hole injecting layer can be formed by vacuum deposition, spin coating, casting, LB technique, or some other method. Vacuum deposition is preferred since an uniform film is easily obtained and pinholes are not easily generated.

In the case where the hole injecting layer is formed by vacuum deposition, conditions for the deposition vary depending on a used compound (the material for the hole injecting layer), the crystal structure or recombining structure of an intended hole injecting layer, and so on. In general, the conditions are appropriately selected from the following: deposition source temperatures of 50 to 450° C., vacuum degrees of $10^{-7}$ to $10^{-3}$ torr, vapor deposition rates of 0.01 to 50 nm/second, substrate temperatures of −50 to 300° C., and film thicknesses of 5 nm to 5 μm.

Next, an emitting layer is formed on the hole injecting layer. The emitting layer can be formed by using a desired organic luminescent material and making the material into a thin film by vacuum deposition, sputtering, spin coating, casting or some other method.

Vacuum deposition is preferred since an uniform film is easily obtained and pinholes are not easily generated. In the case where the emitting layer is formed by vacuum deposition, conditions for the deposition, which vary dependently on a used compound, can be generally selected from conditions similar to those for the hole injecting layer.

Next, an electron-injecting layer is formed on the emitting layer. Like the hole injecting layer and the emitting layer, vacuum deposition is preferred since an uniform film is obtained. Conditions for the deposition can be selected from conditions similar to those for the hole injecting layer and the emitting layer.

Lastly, a cathode is stacked thereon to obtain an organic EL device.

The cathode is made of a metal, and vapor deposition or sputtering may be used. However, vacuum deposition is preferred in order to protect underlying organic layers from being damaged when the cathode film is formed.

For the above fabrication of the organic EL device, it is preferred that the formation from the anode to the cathode is continuously carried out, using only one vacuuming operation.

In order to fabricate organic EL devices separately placed in a plane for emission, a X-Y dot matrix method in which stripe-shaped anodes and cathodes are crossed and a DC voltage is applied to electrodes to allow a crossing part to emit light, and an active matrix method in which either an anode or a cathode is formed in a dot shape and a DC voltage is applied to a certain dot part using a switching display system such as TFT (Thin Film Transister) for emission are exemplified. The stripe-shaped or dot-shaped anode and cathode can be formed by liftoff or etching using photolithography or masking deposition.

(B) Inter-Insulator

Examples of materials for an inter-insulator usually include acrylic resins, polycarbonate resins, polyimide resins, fluorinated polyimide resins, benzoguanamine resins, melamine resins, cyclic polyolefins, Novolak resins, polyvinyl cinnamates, cyclic rubbers, polyvinyl chloride resins, polystyrenes, phenol resins, alkyd resins, epoxy resins, polyurethane resins, polyester resins, maleic acid resins, and polyamide resins.

In the case where the inter-insulator is made of an inorganic oxide, preferred inorganic oxides include silicon oxide ($SiO_2$ or $SiO_x$), aluminum oxide ($Al_2O_3$ or $AlO_x$), titanium oxide ($TiO_3$ or $TiO_x$), yttrium oxide ($Y_2O_3$ or $YO_x$), germanium oxide ($GeO_2$ or $GeO_x$), zinc oxide (ZnO), magnesium oxide (MgO), calcium oxide (CaO), boric acid ($B_2O_3$), strontium oxide (SrO), barium oxide (BaO), lead oxide (PbO), zirconia ($ZrO_2$), sodium oxide ($Na_2O$), lithium oxide ($Li_2O$), potassium oxide ($K_2O$).

The value x in the above inorganic compounds is in the range of $1 \leq x \leq 3$.

In the case where the inter-insulator requires heat-resistance, it is preferred to use acrylic resins, polyimide resins, fluorinated polyimides, cyclic olefins, epoxy resins, or inorganic oxides.

It is preferable to suppress reflection and scattering of external light by making an inter-insulator black or low reflective. To make the film black, the materials for the shielding layer described later can be used. To make the film low reflective, the materials for the reflection preventing film described above can be used.

If these inter insulators are organic, they can be processed into a desired pattern by introducing a photosensitive group thereto and using photolithography, or can be formed into a desired pattern by printing.

The thickness of the inter-insulator depends on the resolution of display, or unevenness of an other member to be combined with the organic EL device, and is preferably 10 nm to 1 mm. This is because such a thickness can make the unevenness of the TFTs and the like sufficiently flat.

Accordingly, the thickness of the inter-insulator is more preferably 100 nm to 100 μm, and still more preferably 100 nm to 10 μm.

(C) Color Conversion Member

A color conversion member has a shielding layer and a shielding layer aperture region including a color conversion layer. The following transparent substrate may be contained if necessary.

(1) Shielding Layer

A shielding layer is used to improve a view angle property by shielding unnecessary light emitted from an organic EL device to prevent a color mixture in an organic EL display.

The thickness of the shielding layer, is usually from 10 nm to 1 mm, preferably from 1 μm to 1 mm, and more preferably from 5 μm to 100 μm. When a color conversion layer is a fluorescent medium, it is preferable to make the shielding layer thicker than a color filter.

The surface of the shielding layer may be of lattice or stripe shape.

A cross-section of the shielding layer is generally of rectangular shape, but it can be of inverted trapezoid or T-shape.

As a material for the shielding layer, metals and black pigments can be given.

Examples of metals are one or two and more of metals or alloys such as Ag, Al, Au, Cu, Fe, Ge, In, K, Mg, Ba, Na, Ni, Pb, Pt, Si, Sn, W, Zn, Cr, Ti, Mo, Ta and stainless. Oxides, nitrides, nitrates, sulfides, sulfates and the like of the above-mentioned metals may be used and carbon may be contained if necessary.

The shielding layer can be formed by forming the above-mentioned materials into a film on a transparent substrate by sputtering, vacuum deposition, CVD, ion plating, electrocrystallization, electroplating, electroless plating or some other method and patterning the film to a pattern of the shielding layer (planar and separate pattern) by photolithography and the like.

Examples of the black pigment include carbon black, titanium black, aniline black and a blackened mixture of the above-mentioned color filter pigments.

A solid is made where these black pigments or the above-mentioned metallic materials are dissolved or dispersed in a binder resin used for a color conversion layer and patterned by the same methods as for the color conversion layer to form a patterned shielding layer.

(2) Color Conversion Layer

For a color conversion layer adjusting and/or converting an emission color of organic EL device, there are the following three cases: a. color filter only, b. fluorescent medium only and c. combination of a color filter and a fluorescent medium.

The color filter is to decompose or cut light to adjust color or improve contrast.

The fluorescent medium is to absorb light from an organic device and emit fluorescence having a longer wavelength.

The color conversion layer preferably contains a fluorescent medium. The fluorescent medium enables to create light whose color is different from the inherent color of organic EL light and to strengthen light of weak color. This allows to enhance the luminous efficiency (reduce the power consumption) of an organic EL display.

Among the above (a) to (c), the combination of a color filter and a fluorescent medium (c) is preferable because of improving luminance despite low-consumption-power, the color purity of display, and the balance of display colors at the time of emitting light in each of three primary colors.

Known structures, formation methods and so on of a color filter and a fluorescent medium can be used. For example, those described in Japanese Patent Application No. 2002-301852 can be used.

(D) Transparent Substrate

A transparent substrate is positioned on the side from which the emission of an organic EL display is outcoupled and is a substrate to support a color conversion layer and a shielding layer. In view of the necessity of transmitting light from an organic EL device, the light transmittance in the visible region of from 400 to 700 nm is preferably 50% or more.

Specific examples of the transparent substrate include a glass plate. In particular, examples of the glass plate include one or two or more of-soda-lime glass, barium/strontium-containing glass, lead glass, aluminosilicate glass, borosilicate glass and barium borosilicate glass.

Plastic plates such as polycarbonate plate and acrylic plate and plastic films such as polyethylene terephthalate film, and polyethersulfide film can also be used.

A plate thickness is not limited since it does not affect a view angle, but if a plate is too thick, it affects light transmittance. It can be generally selected in the range of from 1 μm to 5 mm.

(E) Transparent Medium

A transparent medium is placed between an organic El device, and a color converting layer and a shielding layer and its transmittance to from 400 nm to 700 nm light is preferably 50% or more. The transparent medium is more preferably electrically insulate.

The transparent medium may have a single layered or multi-layered structure. It may be a solid, liquid or gas.

When the transparent medium is a solid, it may be formed from an inorganic material such as the above-mentioned transparent substrates; transparent various resins such as polyphenyl methacrylate, poly-o-chlorostyrene, poly-o-naphthyl methacrylate, polyvinyl naphthalene, polyvinyl carbazol, polyesters containing a fluorene skeleton, ultraviolet curable resins, photo-curable resins, thermosetting resins and adhesives using them; and inorganic materials such as $SiO_2$, $SiOx$, $SiOxNy$, $Si_3N_4$, $Al_2O_3$, $AlOxNy$, $TiO_2$, $TiOx$, $SiAlOxNy$, $TiAlOx$, $TiAlOxNy$, $SiTiOx$, and $SiTiOxNy$ (wherein $0.1 \leq x \leq 2$ and $0.1 \leq y \leq 3$). A medium formed from these inorganic materials may be called "a passivation layer" since they shield water or oxygen.

When the transparent medium is a gas or liquid, inert gases such as nitrogen and argon or inert fluids such as fluorohydrocarbon and silicon oil can be given. The transparent medium can be a vacuated space.

When an organic EL device is attached to a color converting member, adhesives such as photo-curable and thermosetting adhesives having a reactive vinyl group of acrylic acid and methacrylic acid oligomers; adhesives such as moisture curable adhesives such as 2-cyanoacrylates; and thermosetting and chemical curable (a mixture of two liquids) adhesives such as epoxy type can be used.

These transparent media may be formed by spin coating, roll coating, casting and so on when liquid materials are used, and by spattering, vapor deposition, CVD, ion plating and so on when solid materials are used. Inert fluids and inert gases are sealed in an emitting region, shielding the emitting region from the outside.

EXAMPLES

Example 1

(1) Fabrication of Organic EL Display

V259BK (manufactured by Nippon Steel Chemical Co., Ltd.) as the material for a shielding layer (a black matrix: BM) was applied by spin coating to a supporting substrate (OA2 glass manufactured by Nippon Electric Glass Co., Ltd.) having dimensions of 112×143×1.1 mm. Then, ultraviolet rays were applied through a photomask so that a lattice-shaped pattern (an aperture region (A) in the shielding layer:60×280 μm) was formed. The material was then developed using a 2% sodium carbonate aqueous solution and baked at 200° C. to obtain a black matrix (thickness: 1.0 μm) pattern.

V259G (manufactured by Nippon Steel Chemical Co., Ltd.) as the material for a green color filter was applied by spin coating. Then, ultraviolet rays were applied through a photomask aligned with the BM so that 320 rectangular stripe patterns (90-μm line and 240-μm gap) were obtained. The material was then developed using a 2% sodium carbonate aqueous solution and baked at 200° C. to obtain a green color filter (thickness: 1.0 μm) pattern.

V259R (manufactured by Nippon Steel Chemical Co., Ltd.) as the material for a red color filter was applied by spin coating. Then, ultraviolet rays were applied through a photomask adjacent the green color filter (displaced at 110 μm pitch) so that 320 rectangular stripe patterns (90-μm line and 240-μm gap) were obtained. The material was then developed using a 2% sodium carbonate aqueous solution and baked at 200° C. to obtain a red color filter (thickness: 1.0 μm) pattern.

V259B (manufactured by Nippon Steel Chemical Co., Ltd.) as the material for a blue color filter was applied by spin coating. Then, ultraviolet rays were applied through a photomask adjacent the red color filter (displaced at 110 μm) so that 320 rectangular stripe patterns (90-μm line and 240-μm gap) were obtained. The material was then developed using a 2% sodium carbonate aqueous solution and baked at 200° C. to obtain a blue color filter (thickness: 11 μm) pattern between the green filter and the red color filter.

As the material for a green fluorescent layer, ink was prepared by dissolving coumarin 6 in an acrylic negative-type photoresist ("V259PA" manufactured by Nippon Steel Chemical Co., Ltd., solid content: 50%) in an amount of 0.04 mol/kg.(solid content).

The ink was applied to the substrate by spin coating, the photomask used for forming the color filter was positioned to overlap the green color filter, and ultraviolet rays were applied. The ink was then developed using a 2% sodium carbonate aqueous solution and baked at 200° C. to form a green fluorescent layer pattern (thickness: 10 μm).

As the material for a red fluorescent layer, ink was prepared by dissolving 0.53 g of coumarin 6, 1.5 g of basic violet 11, and 1.5 g of rhodamine 6G in 100 g of an acrylic negative-type photoresist ("V259PA" manufactured by Nippon Steel Chemical Co., Ltd., solid content: 50%).

The ink was applied to the substrate by spin coating, the photomask for forming the color filter was positioned to overlap the red color filter, and ultraviolet rays were applied. The ink was then developed using a 2% sodium carbonate aqueous solution and baked at 200° C. to form a red conversion film pattern (thickness: 10 μm).

An acrylic thermosetting resin ("V259PH" manufactured by Nippon Steel Chemical Co., Ltd.) as a transparent medium (a flattenizing film) was applied to the substrate by spin coating and then baked at 200° C. to form a flattenizing film (thickness: 5 μm).

IZO was deposited by sputtering to a thickness of 200 nm.

A positive-type resist ("HPR204" manufactured by Fujifilm Olin Co., Ltd.) was applied to the substrate by spin coating, and ultraviolet rays were applied through a photomask so that a cathode lead portion and a 90-μm line and 20-μm gap stripe pattern were formed. The material was then developed using a TMAH (tetramethylammonium hydroxide) developer and baked at 130° C.

The exposed IZO was etched using an IZO etchant (5% oxalic acid aqueous solution). The resist was treated with a stripper containing ethanolamine as the major component ("N303" manufactured by Nagase & Company, Ltd.) to obtain an IZO pattern (lower electrode: anode, number of lines: 960).

As a first inter-insulator, a negative-type resist ("V259PA" manufactured by Nippon Steel Chemical Co., Ltd.) was applied by spin coating, irradiated with ultraviolet rays through a photomask so that a lattice-shaped pattern was formed, and developed using a TMAH (tetramethylammonium hydroxide) developer. The resulting resist was baked at 200° C. to form an inter-insulator which covered an edge of the IZO (an opening of IZO, that is, an emission region (B) of organic EL display was 70×290 μm).

As a second inter-insulator (partition wall), a negative-type resist ("ZPN1100" manufactured by Zeon Corporation) was applied by spin coating, irradiated with ultraviolet rays through a photomask so that a 20-μm line and 310-μm gap stripe pattern was formed, and postbaked. The negative-type resist was developed using a TMAH (tetramethylammonium hydroxide) developer to obtain a second inter-insulator (partition wall) of an organic film intersecting the IZO stripes.

The resulting substrate was subjected to ultrasonic cleaning in pure water and isopropyl alcohol, dried by air blowing, and subjected to UV cleaning.

The substrate was transferred to an organic deposition device (manufactured by ULVAC, Inc.) and secured on a substrate holder. Molybdenum heating boats were each charged in advance with 4,4',4"-tris[N-(3-methylphenyl)-N-phenylamino]triphenylamine (MTDATA) and 4,4'-bis[N-(1-naphthyl)-N-phenylamino]biphenyl (NPD) as a hole injecting material, 4,4'-bis(2,2-diphenylvinyl)biphenyl (DPVBi) as an emitting material, and tris(8-quinolinol)aluminum (Alq) as an electron injecting material. As a cathode, an AlLi alloy (Li concentration: 10 atm %) was provided on a tungsten filament.

After reducing the pressure inside the vacuum container to $5 \times 10^{-7}$ torr, the layers from the hole-injecting layer to the cathode were stacked as described below without breaking the vacuum.

As the hole injecting layer, MTDATA was deposited to a thickness of 60 nm at a deposition rate of 0.1 to 0.3 nm/sec and NPD was deposited to a thickness of 20 nm at a deposition rate of 0.1 to 0.3 nm/sec. As the emitting layer, DPVBi was deposited to a thickness of 50 nm at a deposition rate of 0.1 to 0.3 nm/sec. As the electron-injecting layer, Alq was deposited to a thickness of 20 nm at a deposition rate of 0.1 to 0.3 nm/sec.

As the cathode (upper electrode), Al and Li were deposited to a thickness of 150 nm at a deposition rate of 0.5 to 1.0 nm/sec. The organic layer (hole injecting layer to electron injecting layer) was deposited using a mask within a display area. The organic layer was formed in advance of display area. The cathode was formed so that the cathode could be connected with the IZO lead electrode formed in advance. The cathode had a pattern (number of lines: 240) automatically separated by the partition walls formed on the substrate in advance.

After fabricating the organic EL device on the substrate as described above, the substrate was transferred to a dry box in which dry nitrogen was circulated while preventing the substrate from contacting the atmosphere. The display section was covered with a soda-lime glass of the sealing substrate in the dry box, and the periphery of the display section was sealed by photo-curable a cationically curable adhesive ("TB3102" manufactured by Three Bond Co., Ltd.).

A full color organic EL display was produced as described above in which the lower electrodes and the upper electrodes formed an XY matrix. A DC voltage was applied between the lower electrode and the upper electrode (lower electrode: (+), upper electrode: (−)). As a result, emission of light occurred at the intersecting point (pixel) of the electrodes.

The edges of an aperture region in a shielding layer of the organic EL display were closer to the center of the aperture region than the edges of the emitting region of the organic EL device. The perpendicular distance h of the organic EL display was 16.2 μm, the overlapping part X was 5.0 μm and X/h was 0.31.

(2) Evaluation of Contrast

Fluorescent light was illuminated to the organic EL display obtained in a non-emission state (a voltage was not applied between electrodes) from an angle of 45° with respect to its display surface (display surface illuminance: 1000 lux). The light reflected in the direction perpendicular to the display surface was measured for luminance using a spectroradiometer (CS1000: Minolta). The luminance was 1.5 nit.

While fluorescent light was illuminated in the same manner, a DC voltage was applied to the lower and upper electrodes of the organic EL display (lower electrode: (+), upper electrode: (−)), all colors are lightened and the voltage was adjusted to set the luminance at 100 nit by using the spectroradiometer. The driving voltage at this time was 7 V.

It was found that when fluorescent light of 1000 lux was illuminated, the contrast of the organic EL display was 100 (luminance during emission):1.5 (luminance during non-emission), that is, 67:1.

Table 1 shows dimensions of individual parts, X/h values, contrast ratios and driving voltages of the organic EL displays fabricated in Example 1, and Examples and Comparative Examples described below.

TABLE 1

|  | Aperture region in shielding layer (A) (μm × μm) | Emission area of organic EL device (B) (μm × μm) | Overlapping area X (μm) | Perpendicular distance h (μm) | X/h | Area ratio between (A) and (B) [A/B (%)] | Contrast ratio *1 | Driving voltage (V) *2 |
|---|---|---|---|---|---|---|---|---|
| Example 1 | 60 × 280 | 70 × 290 | 5.0 | 16.2 | 0.31 | 83 | 67:1 | 7 |
| Example 2 | 60 × 280 | 70 × 290 | 5.0 | 8.3 | 0.60 | 83 | 77:1 | 7 |
| Example 3 | 60 × 280 | 70 × 290 | 5.0 | 7.0 | 0.71 | 83 | 100:1 | 7 |
| Example 4 | 60 × 280 | 70 × 290 | 5.0 | 5.2 | 0.96 | 83 | 143:1 | 7 |
| Example 5 | 60 × 190 | 70 × 200 | 5.0 | 5.4 | 0.93 | 81 | 143:1 | 8 |
| Example 6 | 60 × 190 | 70 × 200 | 5.0 | 5.4 | 0.93 | 81 | 167:1 | 8 |
| Comparative Example 1 | 70 × 290 | 70 × 290 | 0 | 16.2 | 0 | 100 | 50:1 | 7 |
| Comparative Example 2 | 70 × 290 | 60 × 280 | −5.0 | 16.2 | −0.31 | 121 | 33:1 | 7 |
| Example 7 | 50 × 270 | 70 × 290 | 10 | 16.2 | 0.62 | 67 | 77:1 | 8 |

*1 The contrast ratio was the luminance ratio of an organic EL display between all lighting (luminance: 100 nit) and non-lighting under 1000 lux fluorescent illumination.
*2 The driving voltage was the value at a luminance of 100 nit in all lighting under 1000 lux fluorescent illumination.

Example 2

(1) Fabrication of Organic EL Display

V259G (manufactured by Nippon Steel Chemical Co., Ltd.) as the material for a green color filter was applied by spin coating to a supporting substrate (transparent substrate) (OA2 glass manufactured by Nippon Electric Glass Co., Ltd.) having dimensions of 112×143×1.1 mm. Then, ultraviolet rays were applied through a photomask so that 320 rectangular stripe patterns (90-μm line and 240-μm gap) were obtained. The material was then developed using a 2% sodium carbonate aqueous solution and baked at 200° C. to obtain a green color filter (thickness: 1.0 μm) pattern.

V259R (manufactured by Nippon Steel Chemical Co., Ltd.) as the material for a red color filter was applied by spin coating. Then, ultraviolet rays were applied through a photomask the green color filter (displaced at 110 μm pitch) adjacent so that 320 rectangular stripe patterns (90-μm line and 240-μm gap) were obtained. The material was then developed using a 2% sodium carbonate aqueous solution and baked at 200° C. to obtain a red color filter (thickness: 1.0 μm) pattern.

V259BK (manufactured by Nippon Steel Chemical Co., Ltd.) as the material for a shielding layer (a black matrix: BM) was applied by spin coating. Then, ultraviolet rays were applied through a photomask so that a lattice-shaped pattern (the aperture region 60×280 μm) was formed. The material was then developed using a 2% sodium carbonate aqueous solution and baked at 200° C. to obtain a black matrix (thickness: 12 μm) pattern.

V259B (manufactured by Nippon Steel Chemical Co., Ltd.) as the material for a blue color filter was applied by spin coating. Then, ultraviolet rays were applied through a photomask aligned with the BM so that 320 rectangular stripe patterns (90-μm line and 240-μm gap) were obtained. The material was then developed using a 2% sodium carbonate aqueous solution and baked at 200° C. to obtain a blue color filter (thickness: 12 pm) pattern between the green filter and the red color filter.

As the material for a green fluorescent layer, ink was prepared by dissolving coumarin 6 in an acrylic negative-type photoresist ("V259PA" manufactured by Nippon Steel Chemical Co., Ltd., solid content: 50%) in an amount of 0.04 mol/kg (solid content).

The ink was applied to the substrate by spin coating, the photomask for fabrication of the color filter was positioned to overlap the green color filter, and ultraviolet rays were applied to the ink in the area of the green color filter. The ink was then developed using a 2% sodium carbonate aqueous solution and baked at 200° C. to form a green fluorescent layer pattern. (thickness: 11 μm).

As the material for a red fluorescent layer, ink was prepared by dissolving 0.53 g of coumarin 6, 1.5 g of basic violet 11, and 1.5 g of rhodamine 6G in 100 g of an acrylic negative-type photoresist ("V259PA" manufactured by Nippon Steel Chemical Co., Ltd., solid content: 50%).

The ink was applied to the substrate by spin coating, the photomask for fabrication of the color filter was positioned to overlap the red color filter, and ultraviolet rays were applied to the ink in the area of the red color filter. The ink was then developed using a 2% sodium carbonate aqueous solution and baked at 200° C. to form a red fluorescent layer pattern (thickness: 11 μm).

Then, the substrate surface was lapped and polished to produce a smoothened color conversion member.

An acrylic thermosetting resin ("V259PH" manufactured by Nippon Steel Chemical Co., Ltd.) was applied to the substrate by spin coating and then baked at 200° C. to form a flattenizing film (thickness: 8.1 μm).

IZO (indium zinc oxide) was deposited by sputtering to a thickness of 200 nm.

A positive-type resist ("HPR204" manufactured by Fujifilm Olin Co., Ltd.) was applied to the substrate by spin coating, and ultraviolet rays were applied through a photomask so that a cathode lead portion and a 90-μm line and 20-μm gap stripe pattern were formed. The material was then developed using a tetramethylammonium hydroxide (TMAH) developer and baked at 130° C.

The exposed IZO was etched using an IZO etchant (5% oxalic acid aqueous solution). The resist was treated with a stripper containing ethanolamine as the major component ("N303" manufactured by Nagase & Company, Ltd.) to obtain an IZO pattern (lower electrode: anode, number of lines: 960).

Thereafter, first and second inter-insulators and individual layers of an organic EL device were formed under the same conditions as in Example 1 to fabricate an organic EL display.

The perpendicular distance h of the organic EL display was 8.3 μm, the overlapping part X was 5.0 and X/h was 0.60.

(2) Evaluation of Contrast

As a result of the evaluation by the same method as in Example 1, it was found that when fluorescent light of 1000 lux was illuminated, the contrast of the organic EL display was 100 (luminance during emission):1.3 (luminance during non-emission), that is, 77:1.

Example 3

An organic EL display was fabricated under the same conditions as in Example 2 except that the thickness of a transparent medium (flattenizing film) was 6.8 µm.

The perpendicular distance h of the organic EL display was 7.0 µm, the overlapping part X was 5.0 µm and X/h was 0.71.

As a result of the contrast evaluation done in the same method as in Example 1, it was found that when fluorescent light of 1000 lux was illuminated, the contrast of the organic EL display was 100 (luminance during emission):1.0 (luminance during non-emission), that is, 100:1.

Example 4

An organic EL display was fabricated under the same conditions as in Example 2 except that the thickness of a transparent medium (flattenizing film) was 5.0 µm.

The perpendicular distance h of the organic EL display was 5.2 µm, the overlapping part X was 5.0 µm and X/h was 0.96.

As a result of the contrast evaluation done in the same method as in Example 1, it was found that when fluorescent light of 1000 lux was illuminated, the contrast of the organic EL display was 100 (luminance during emission):0.7 (luminance during non-emission), that is, 143:1.

Example 5

(1) Fabrication of TFT Substrate

FIGS. 6(a) to 6(i) are views showing polysilicon TFT formation steps. FIG. 7 is a circuit diagram showing an electric switch connection structure including a polysilicon TFT, and FIG. 8 is a planar perspective view showing an electric switch connection structure including a polysilicon TFT.

An α-Si layer 32 was stacked on a glass substrate 31 (OA2 glass manufactured by Nippon Electric Glass Co., Ltd.) having dimensions of 112×143×1.1 mm by a method such as low pressure chemical vapor deposition (LPCVD) (FIG. 6(a)).

Then, crystallization annealing was performed by applying an examiner laser such as a KrF (248 nm) laser to the α-Si layer 32 to form polysilicon (FIG. 6(b)). The polysilicon was patterned in the shape of an island by photolithography (FIG. 6(c)). An insulating gate material 34 was stacked on the surfaces of the island-shaped polysilicon 33 and the substrate 31 by chemical vapor deposition (CVD) or the like to form a gate oxide insulating layer 34 (FIG. 6(d)). After depositing a gate electrode 35 by deposition or sputtering (FIG. 6(e)), the gate electrode 35 was patterned and anodic oxidation was performed (FIGS. 6(f) to 6(h)). Then, doped regions (active layer) were formed by ion doping (ion implantation) to form a source 36 and a drain 37 to obtain a polysilicon TFT (FIG. 6(i)). The gate electrode 35 (and scan electrode 50 and bottom electrode of capacitor 57 shown in FIG. 7) was formed from Al, and the source 36 and the drain 37 of the TFT were an $n^+$-type.

Figure 7:
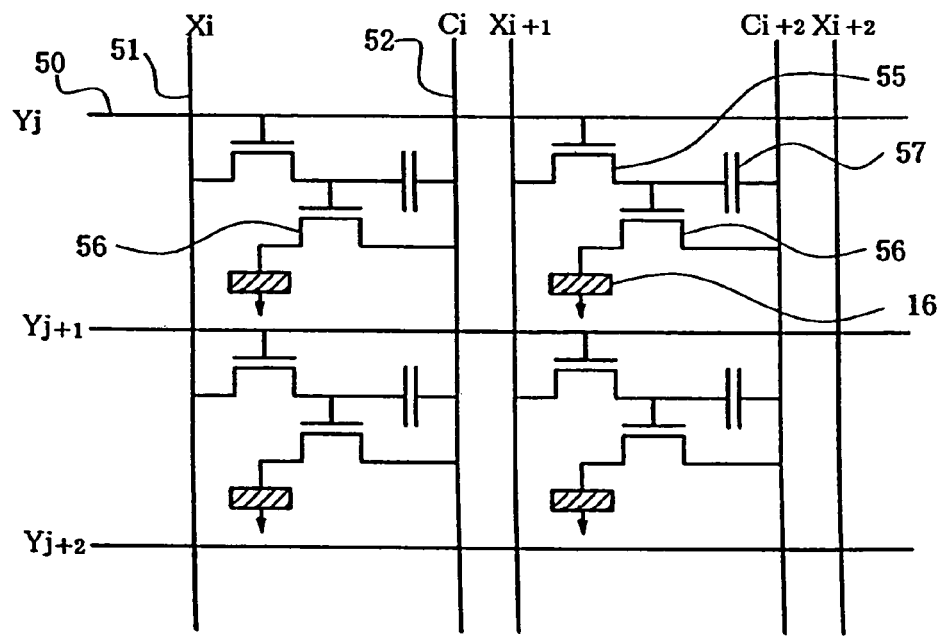
FIG. 7 is a circuit diagram showing an electric switch connection structure including a polysilicon TFT.
Figure 8:
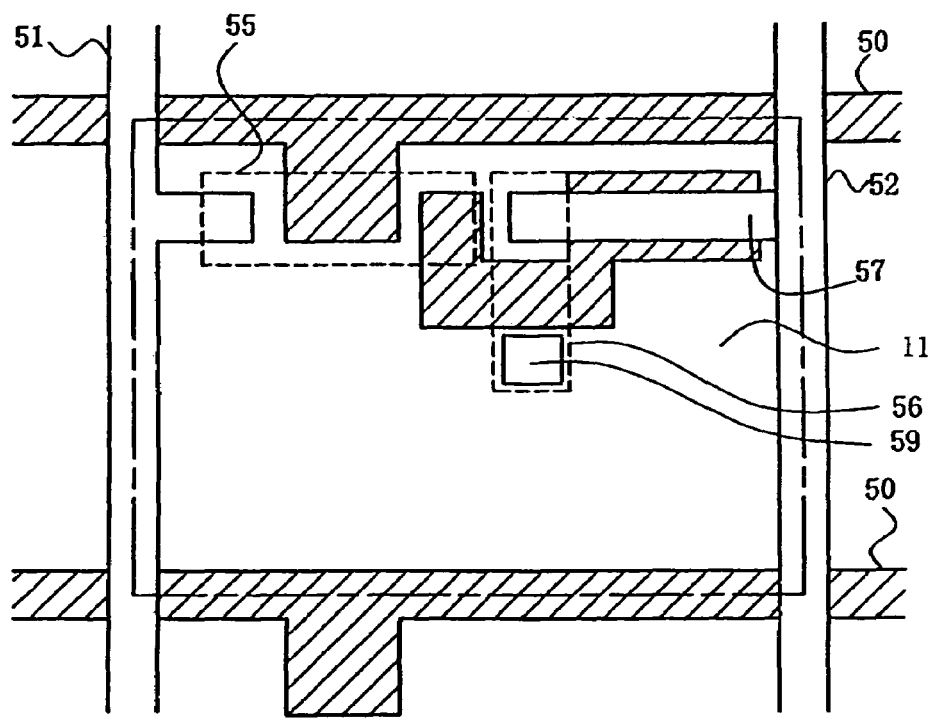
FIG. 8 is a planar perspective view showing an electric switch connection structure including a polysilicon TFT.
Figure 9:
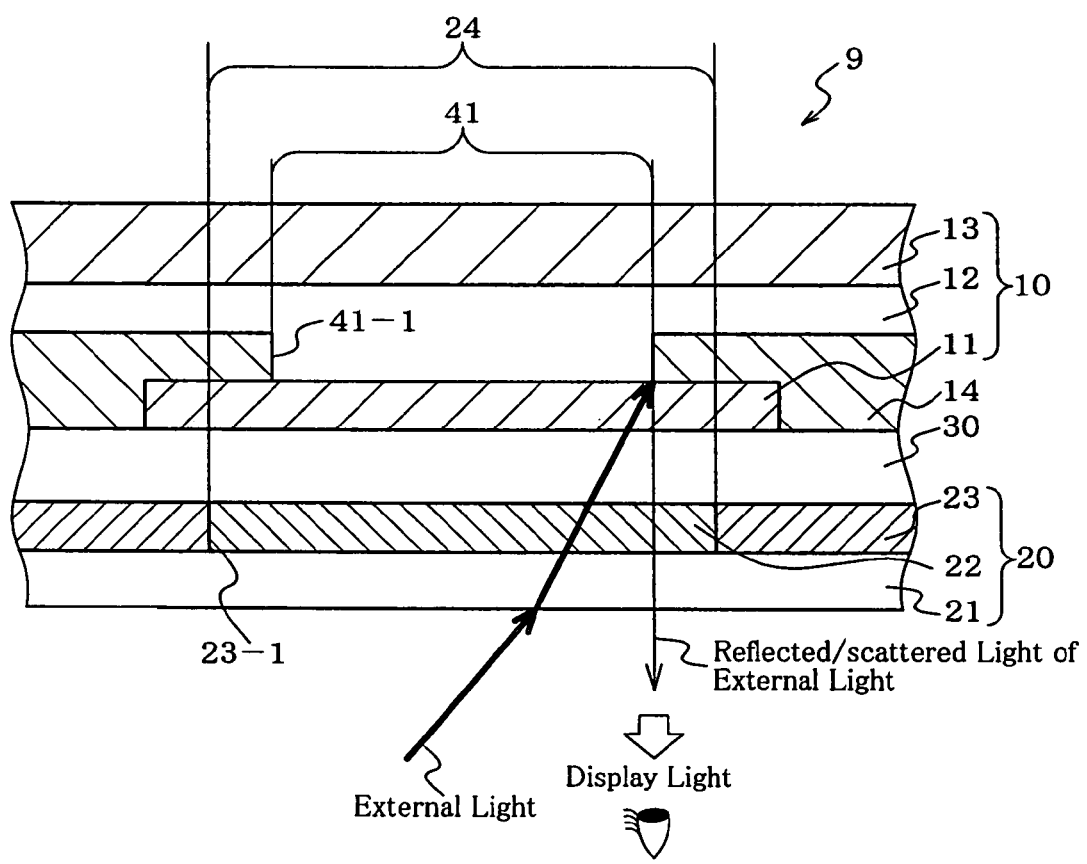
FIG. 9 isa view showing a conventional organic EL display.

After forming an inter-insulator ($SiO_2$) having a thickness of 500 nm on the active layer by a CRCVD method, a signal electrode 51, a common electrode 52, and a capacitor 57 upper electrode (Al) were formed, a source electrode of a second transistor (Tr2) 56 was connected with the common electrode, and a drain of a first transistor (Tr1) 55 was connected with the signal electrode (FIGS. 7 and 8). The TFT and the electrode were connected after appropriately removing the inter-insulator $SiO_2$ by wet etching using hydrofluoric acid.

Then, Cr and ITO were deposited by sputtering to a thickness of 2000 angstroms and 1300 angstroms, respectively. A positive-type resist ("HPR204" manufactured by Fujifilm Olin Co., Ltd.) was applied to the substrate by spin coating, and ultraviolet rays were applied through a photomask so that a 90×320 µm dot-shaped pattern was formed. The material was then developed using a tetramethylammonium hydroxide (TMAH) developer and baked at 130° C. to obtain a resist pattern.

The exposed ITO was etched using an ITO etchant containing 47% hydrobromic acid, and the Cr was etched using a ceric ammonium nitrate/perchloric acid aqueous solution ("HCE" manufactured by Nagase & Company, Ltd.). The resist was treated with a stripper containing ethanolamine as the major component ("N303" manufactured by Nagase & Company, Ltd.) to obtain a Cr/ITO pattern (lower electrode: anode).

Figure 6:
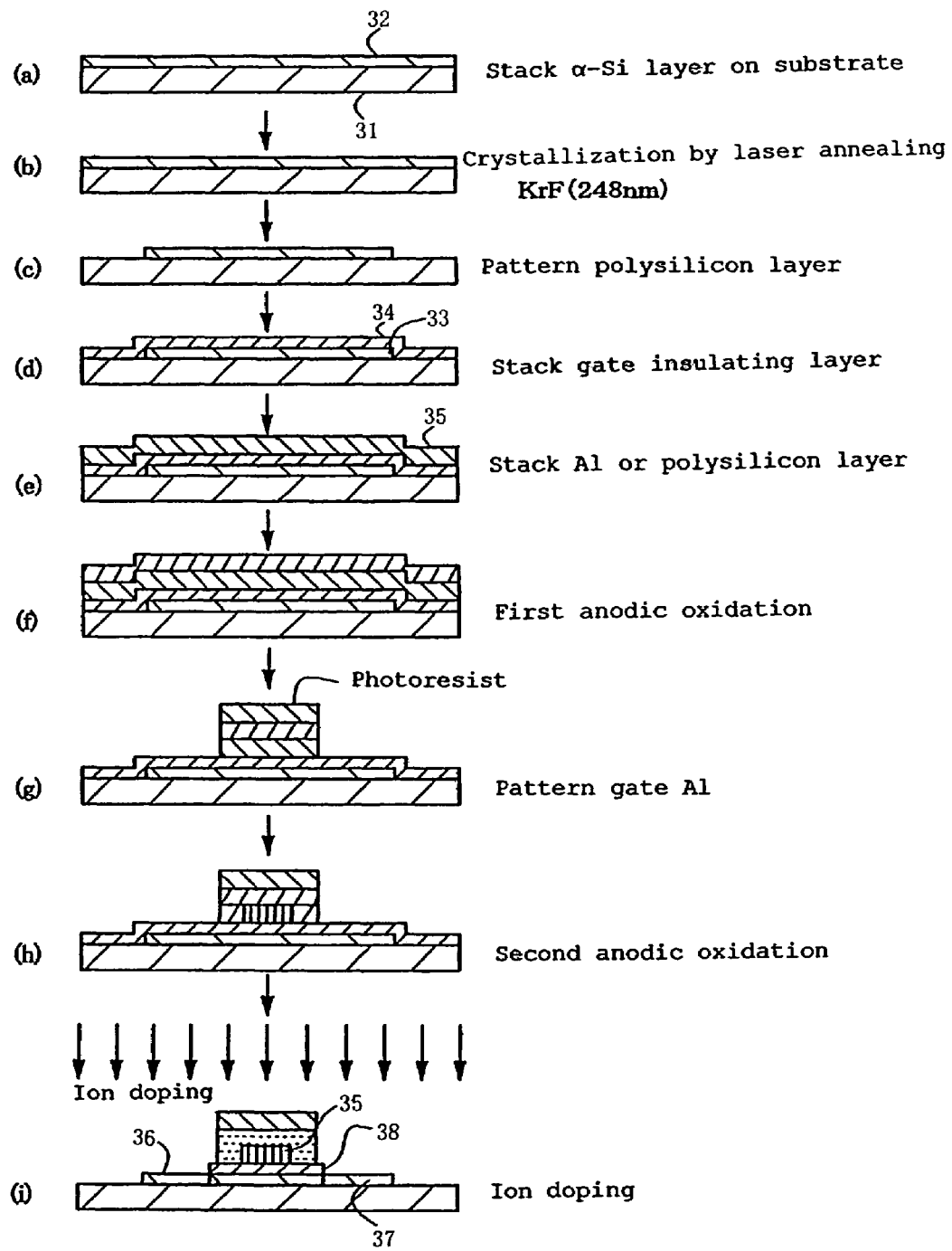
FIG. 6 is a view showing steps of forming a polysilicon TFT.

In this step, the second transistor Tr2 56 and the lower electrode 11 were connected through an opening 59 (FIG. 6).

As a second inter-insulator, a negative-type resist ("V259PA" manufactured by Nippon Steel Chemical Co., Ltd.) was applied by spin coating, irradiated with ultraviolet rays, and developed using a tetramethylammonium hydroxide (TMAH) developer. The resulting material was baked at 200° C. to form an inter-insulator which covered the edge of the Cr/ITO (the aperture, that is, emission region of organic EL, 70×200 µm (not shown)).

(2) Fabrication of Organic EL Device

The TFT substrate obtained in (1) on which the inter-insulator was formed was subjected to ultrasonic cleaning in pure water and isopropyl alcohol, dried by air blowing, and subjected to UV cleaning.

The TFT substrate was transferred to an organic deposition device (manufactured by ULVAC, Inc.) and secured on a substrate holder. Each molybdenum heating boat was charged in advance with 4,4',4"-tris[N-(3-methylphenyl)-N-phenylamino]triphenylamine (MTDATA) and 4,4'-bis[N-(1-naphthyl)-N-phenylamino]biphenyl (NPD) as a hole injecting material, 4,4'-bis(2,2-diphenylvinyl)biphenyl (DPVBi) as a host of an emitting material, 1,4-bis[4-(N,N-diphenylaminostyrylbenzene)] (DPAVB) as a dopant, and tris(8-quinolinol)aluminum (Alq) and Li as an electron injecting material and a cathode. An IZO (mentioned above) target was placed in another sputtering container as a cathode lead electrode.

After reducing the pressure inside the vacuum container to $5 \times 10^{-7}$ torr, the layers from the hole injecting layer to the cathode were stacked as described below without breaking the vacuum.

As the hole injecting layer, MTDATA was deposited to a thickness of 60 nm at a deposition rate of 0.1 to 0.3 nm/sec and NPD was deposited to a thickness of 20 nm at a deposition rate of 0.1 to 0.3 nm/sec. As the emitting layer, DPVBi and DPAVB were co-deposited to a thickness of 50 nm at a deposition rate of 0.1 to 0.3 nm/sec and 0.03 to 0.05 nm/sec, respectively. As the electron injecting layer, Alq was deposited to a thickness of 20 nm at a deposition rate of 0.1 to 0.3 nm/sec. As the cathode, Alq and Li were co-deposited to a thickness of 20 nm at a deposition rate of 0.1 to 0.3 nm/sec and 0.005 nm/sec, respectively.

Then, the substrate was transferred to the sputtering container, and IZO was deposited to a thickness of 200 nm at a deposition rate of 0.1 to 0.3 nm/sec as the lead electrode of the cathode to obtain an organic EL device.

Next, as a passivation layer (first transparent medium), a 200 nm thick SiOxNy(O/(O+N)=50%: atomic ratio) film of a transparent inorganic film was formed by low temperature CVD on the upper electrode of the organic EL device. An organic EL device substrate was thus obtained.

(3) Fabrication of Color Conversion Member

A color conversion substrate was fabricated under the same conditions as in Example 2 except that a shielding layer aperture region was 60 μm×190 μm and the thickness of a flattenizing layer was 1 μm (the steps after the formation of the flattenizing layer (third transparent medium) were not conducted).

(4) Fabrication of Organic EL Display

The organic EL device and color conversion member obtained were transferred to a dry box in which dry nitrogen was flown and a cation type photo-curable adhesive ("3102" manufactured by Three Bond Co., Ltd.) was applied on the periphery of the display section of the organic EL device substrate by a dispenser.

Next, the organic EL device was adhered to the color conversion member with positioning marks matched by light irradiation. The part corresponding to the display section was filled with a degassed inert fluid (second transparent medium, fluorohydrocarbon: FC70, manufactured by 3M).

The gap between the organic EL device and color conversion member was 4 μm.

An active organic EL display was produced as described above. A DC voltage of 8 V was applied between the lower electrode (ITO/Cr) and the upper electrode (IZO) (lower electrode: (+), upper electrode: (−)). As a result, emission occurred at the intersecting point (pixel) of the electrodes.

The perpendicular distance h of the organic EL display was 5.4 μm, the overlapping part X was 5.0 and X/h was 0.93.

(5) Evaluation of Contrast

As a result of the evaluation by the same method as in Example 1, it was found that when fluorescent light of 1000 lux was illuminated, the contrast of the organic EL display was 100 (luminance during emission):0.7 (luminance during non-emission), that is, 143:1.

Example 6

(1) Fabrication of Organic EL Display

An organic EL display was fabricated under the same conditions as in Example 5 except that a reflection preventing film was positioned on a transparent substrate outside a color conversion member. The reflection preventing film was formed by stacking three units of 0.2 pm thick silicon oxide and 0.2 g m thick titanium oxide films by deposition from the transparent substrate side.

(2) Evaluation of Contrast

As a result of the evaluation by the same method as in Example 1, it was found that when fluorescent light of 1000 lux was illuminated, the contrast of the organic EL display was 100 (luminance during emission):0.6 (luminance during non-emission), that is, 167:1.

Comparative Example 1

(1) Fabrication of Organic EL Display

An organic EL display was fabricated under the same conditions as in Example 1 except that a shielding layer aperture region of a color conversion member was 70×290 μm and the emission region of an organic EL device was 70×290 μm. The overlapping part (X) was 0 in this display.

(2) Evaluation of Contrast

As a result of the evaluation by the same method as in Example 1, it was found that when fluorescent light of 1000 lux was illuminated, the contrast of the organic EL display was 100 (luminance during emission):2 (luminance during non-emission), that is, 50:1.

Comparative Example 2

(1) Fabrication of Organic EL Display

An organic EL display was fabricated under the same conditions as in Example 1 except that a shielding layer aperture region of a color conversion member was 70×290 pm and the emission region of an organic EL was 60×280 μm. The overlapping part (X) was smaller than 0 (−5.0 μm) in this display.

(2) Evaluation of Contrast

As a result of the evaluation by the same method as in Example 1, it was found that when fluorescent light of 1000 lux was illuminated, the contrast of the organic EL display was 100 (luminance during emission):3 (luminance during non-emission), that is, 33:1.

Example 7

(1) Fabrication of Organic EL Display

An organic EL display was fabricated under the same conditions as in Example 1 except that a shielding layer aperture region was 50×270 μm.

(2) Evaluation of Contrast

As a result of the evaluation by the same method as in Example 1, it was found that when fluorescent light of 1000 lux was illuminated, the contrast of the organic EL display was 100 (luminance during emission):1.3 (luminance during non-emission), that is, 77:1. The driving voltage was 8 V at a luminance of 100 nit.

INDUSTRIAL APPLICABILITY

An organic EL display of the invention can be used for all industrial and consumer displays (cell-phone, automobile and indoor use).

The invention claimed is:

1. An organic electroluminescent display comprising:
   i) an organic electroluminescent device; and
   ii) a color converting member, said color converting member comprising
      a shielding layer and
      a shielding layer aperture region comprising a color converting layer, wherein edges of the aperture region are closer to the center of the aperture region than edges of an emission region of the organic electroluminescent device, and
   wherein a perpendicular distance h (μm) from the shielding layer to an emitting layer of the organic electroluminescent device and a length X (μm) of an overlapping part of the shielding layer and the emission region satisfy expression (I):

$$X/h \geq 0.60 \quad (I).$$

2. The organic electroluminescent display according to claim 1, wherein the area of the shielding layer aperture region is 70% or more of the area of the organic electroluminescent emission region.

3. The organic electroluminescent display according to claim 1, further comprising a reflection preventing part on the side of the color converting member from which light from the organic electroluminescent device is outcoupled.

4. The organic electroluminescent display according to claim 3, wherein the reflection preventing part is a reflection preventing film.

5. The organic electroluminescent display according to claim 3, wherein the reflection preventing part is a non-glare film.

6. The organic electroluminescent display according to claim 1, further comprising a transparent medium layer between the organic electroluminescent device and the color converting member.

7. The organic electroluminescent display according to claim 1, which is actively driven.

8. The organic electroluminescent display according to claim 1, wherein h ranges from 0.05 to 100 μm.

9. The organic electroluminescent display according to claim 8, wherein h ranges from 0.05 to 20 μm.

10. The organic electroluminescent display according to claim 1, wherein the area of the shielding layer aperture region is 80% or more of the area of the organic electroluminescent emission region.

* * * * *